United States Patent
Jaussi et al.

(10) Patent No.: US 7,362,837 B2
(45) Date of Patent: Apr. 22, 2008

(54) METHOD AND APPARATUS FOR CLOCK DESKEW

(75) Inventors: James E. Jaussi, Hillsboro, OR (US); Bryan K. Casper, Hillsboro, OR (US); Ganesh Balamuragan, Urbana, IL (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 871 days.

(21) Appl. No.: 10/652,908

(22) Filed: Aug. 29, 2003

(65) Prior Publication Data

US 2005/0047538 A1    Mar. 3, 2005

(51) Int. Cl.
    *H04L 7/02* (2006.01)
(52) U.S. Cl. .................................... 375/360
(58) Field of Classification Search ............... 375/360, 375/355, 142, 367; 710/100; 714/798; 327/237, 327/107
See application file for complete search history.

(56) References Cited

U.S. PATENT DOCUMENTS

| | | | | |
|---|---|---|---|---|
| 4,667,327 A * | 5/1987 | Bright et al. | ............... | 714/798 |
| 4,847,874 A * | 7/1989 | Kroeger et al. | ............. | 375/360 |
| 5,036,230 A * | 7/1991 | Bazes | .......................... | 327/107 |
| 5,163,070 A * | 11/1992 | Bielby et al. | ................ | 375/367 |
| 5,341,404 A * | 8/1994 | Sevenhans et al. | ......... | 375/355 |
| 6,587,500 B1 * | 7/2003 | Persson et al. | ............. | 375/142 |
| 7,180,352 B2 * | 2/2007 | Mooney et al. | ............. | 327/237 |
| 2001/0056512 A1 * | 12/2001 | Mok et al. | ................... | 710/100 |

* cited by examiner

*Primary Examiner*—Don N Vo
(74) *Attorney, Agent, or Firm*—Dana B. Lemoine; Lemoine Patent Services, PLLC

(57) ABSTRACT

A clock signal is deskewed relative to a data signal by sweeping a sampling point in time and sweeping an amplitude offset. Bit error measurements are made at each sampling point in time and compared. Bit error measurements may be made by comparing received data to predetermined data values. The predetermined data values may be sourced from a linear feedback shift register.

20 Claims, 6 Drawing Sheets

METHOD AND APPARATUS FOR CLOCK DESKEW

FIELD

The present invention relates generally to communications circuits, and more specifically to communications circuits that utilize clock signals.

BACKGROUND

Signals received by "receivers" travel through "channels." A channel may be any medium through which a signal can travel. Channels may have undesired effects on signals, such as delay, amplitude attenuation or phase distortion. Data signals and clock signals may travel through separate channels, resulting in different amounts of delay, attenuation, or distortion, collectively referred to herein as "clock skew."

DESCRIPTION OF EMBODIMENTS

Figure 1:
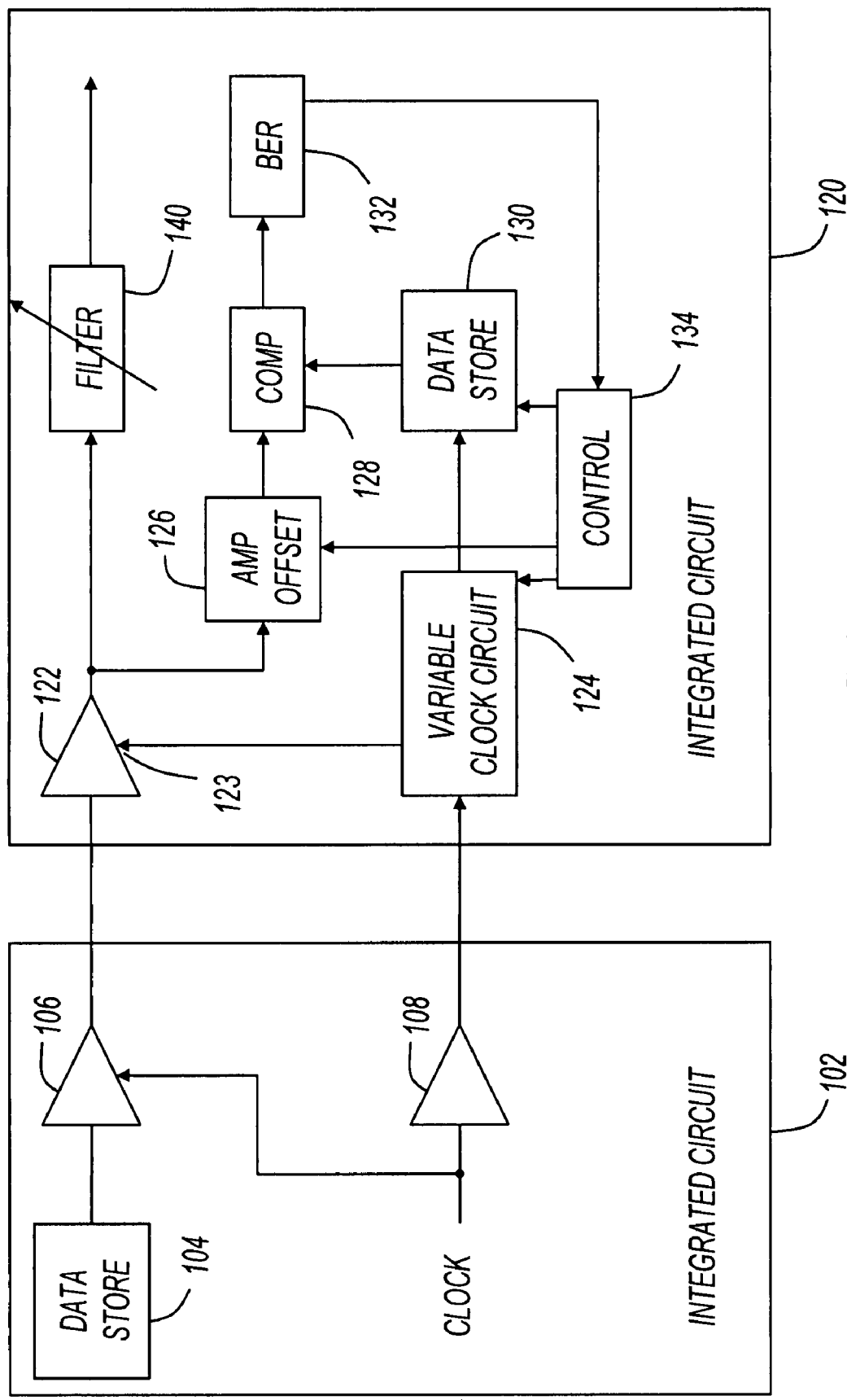
FIG. 1 shows a diagram of two interconnected integrated circuits.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of two interconnected integrated circuits 102 and 120. Integrated circuit 102 includes data store 104, data driver 106, and clock driver 108. Integrated circuit 120 includes data receiver 122, variable clock circuit 124, amplitude offset circuit 126, comparator 128, data store 130, bit error rate (BER) circuit 132, control circuit 134, and adaptive filter 140. Each integrated circuit may include many more circuits that are not shown in FIG. 1.

Data receiver 122 includes clock control input 123. Clock control input 123 is coupled to the output of variable clock circuit 124. Variable clock circuit 124 receives a clock from integrated circuit 102, possibly modifies the phase of the clock as commanded by control circuit 134, and provides the modified clock to receiver 122. In some embodiments, data receiver 122 may include an analog to digital converter such that adaptive filter 140 and amplitude offset circuit 126 each receive a digital word. In other embodiments, data receiver 122 may include an analog sampling circuit that provides an analog voltage to both adaptive filter 140 and amplitude offset circuit 126.

During normal operation of integrated circuit 120, data is received from the data channel and sampled by receiver 122, and the received data passes through adaptive filter 140 to equalize the effects of the data channel. Prior to normal operation, adaptive filter 140 undergoes a training period to adapt to the channel. For example, when a system is powered up, or when circuits are otherwise initialized, adaptive filter 140 may use any of a variety of adaptive filter algorithms to adapt to the channel.

When clock skew is present, and especially when clock skew is severe, it may be difficult for adaptive filter 140 to adapt to the channel. For example, if receiver 122 samples the data signal while it is transitioning rather than when it is stable, adaptive filter 140 may have trouble adapting to the channel. The various circuit blocks shown in FIG. 1 aid in reducing the effects of clock skew. The process of reducing the effects of clock skew is referred to herein as "deskewing" the clock or providing "clock deskew."

In some embodiments, clock deskew is provided by determining a suitable sampling point in time relative to a received clock. For example, a data signal is received by data receiver 122 and a clock signal is received by variable clock circuit 124. The received clock signal passes through variable clock circuit 124, and is then used to provide a sampling time point for data receiver 122. Variable clock circuit 124 may alter the phase of the clock signal prior to providing it to data receiver 122.

In some embodiments, clock deskew is performed in two phases: a coarse alignment phase, and a fine alignment phase. During the coarse alignment phase, integrated circuit 102 sends a clock signal on the clock channel, and a string of one digital value followed by a string of another digital value on the data channel. For example, clock driver 108 may source a digital clock, and data store 104 may send 64 zeros followed by 64 ones. Integrated circuit 120 may detect that the incoming data has transitioned from one data value to another. While integrated circuit 120 may not detect the exact "transition point" where the data transitions, it may detect an "estimated transition point" that approximates the actual transition point within a reasonable error. This provides a coarse alignment. This may hold true even if the channel is not equalized.

During the fine alignment, data store 104 sends a repeating data pattern to serve as a training sequence. In some embodiments, data store 104 includes a shift register, and in other embodiments, data store 104 includes a linear feedback shift register (LFSR), although the present invention is not limited in this respect. In some embodiments, data store 104 begins sending the training sequence at a known time point relative to the transition point described above with reference to the coarse alignment.

During the fine alignment, data store 130 within integrated circuit 120 provides a repeating data pattern that matches the training sequence provided by data store 104. In some embodiments, data store 130 includes a shift register or an LFSR, although the present invention is not limited in this respect. In some embodiments, data store 130 begins sending the repeating data pattern at a known time relative to the estimated transition point described above with reference to the coarse alignment. Control circuit 134 may accomplish this by time aligning the internal data sequence sourced by data store 130 to the estimated transition point. The repeating data patterns provided by data stores 104 and 130 may be the same patterns; however they may only be time-aligned to within the error associated with the coarse alignment described above.

Control circuit 134 provides control signals to variable clock circuit 124 and data store 130 in an attempt to time align data provided by data store 130 with data received and sampled by receiver 122. In some embodiments, control circuit 134 may command data store 130 to start a repeating data pattern or to time-shift the repeating data pattern. In some embodiments, control circuit 134 may command control store 130 to provide a variable amount of time shift of the repeating data pattern. Control circuit 134 may be any type of circuit capable of providing control information to the various blocks shown in FIG. 1. For example, control circuit 134 may include a state machine, a processor, a memory mapped interface, a scan register interface, or the like.

Amplitude offset circuit 126 provides a variable amount of amplitude offset. For example, in some embodiments, amplitude offset circuit 126 receives a digital word, and adds or subtracts a digital value to provide an offset. Also for example, in some embodiments, amplitude offset circuit 126 receives an analog voltage or current and sums a voltage or current to provide the offset. In some embodiments, control circuit 134 commands amplitude offset circuit 126 to sum a zero offset, and in other embodiments, the amplitude offset is swept over a range of offset values, for one or more time sampling points. The various uses of amplitude offset circuit are further described below.

Comparator 128 compares received data (with a possible amplitude offset) and data from data store 130, and sends error data to bit error rate circuit 132. Bit error rate circuit 132 sends bit error rate information to control circuit 134. If the data stores are time aligned, and if receiver 122 is sampling at an appropriate point within the bit cell, then the bit error rate will be comparatively low. Otherwise, the bit error rate will be higher.

In some embodiments, control circuit 134 varies parameters and monitors the bit error rate in an attempt to find an appropriate sampling point. For example, in some embodiments, control circuit 134 varies control information sent to variable clock circuit 124, varies the timing of data store 130, and varies control information sent to amplitude offset circuit 126, and monitors the bit error rate.

Figure 2:
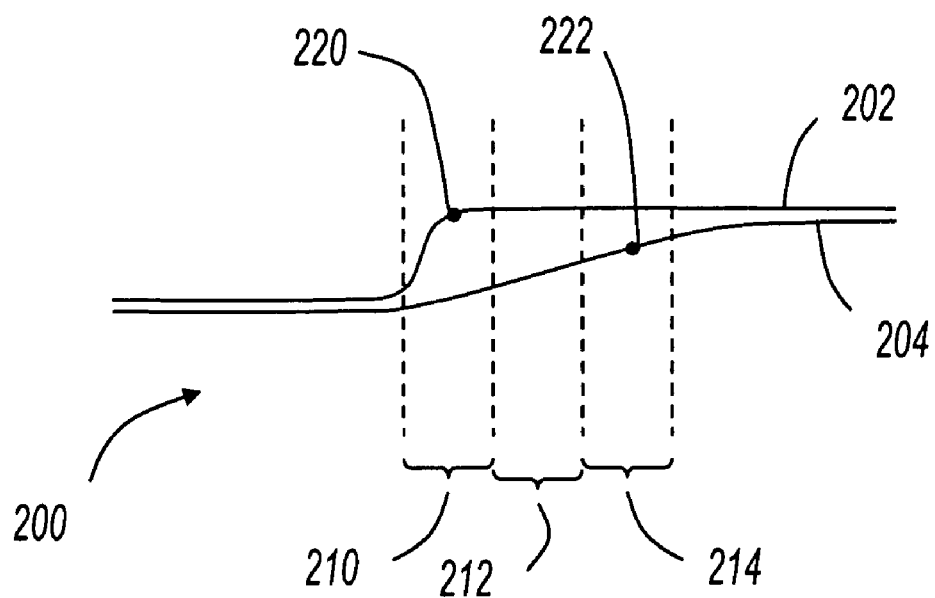
FIG. 2 shows a waveform plot with bit intervals and sampling points.

FIG. 2 shows a waveform plot with bit intervals and sampling points. Included in plot 200 are waveforms 202 and 204. Waveform 202 represents a data signal output from integrated circuit 102 (FIG. 1) during coarse alignment. Waveform 202 may be produced by sending a string of zeros followed by a string of ones. Waveform 204 represents the same signal as it is received by integrated circuit 120 after traveling through the data channel.

Bit intervals are shown at 210, 212, and 214. These bit intervals correspond to bit intervals at the transmitter. For example, the transition point between the string of zeros and the string of ones occurs at the beginning of bit interval 210, and time point 220 corresponds to the first bit interval having a one. Waveform 202 is shown having a relatively sharp transition, because the effects of the channel are not yet a factor in the integrity of the signal.

Waveform 204 exhibits a less sharp transition, due in part to the effects of the channel. In the example shown in FIG. 2, integrated circuit 120 estimates the transition point at sampling point 222; however this may not represent the most appropriate sampling point for the purposes of training the filter or for reliably receiving data through the channel. A more appropriate sampling point may be earlier or later than the estimated transition point.

When the transition point is estimated, the coarse alignment phase is complete. As described above with reference to FIG. 1, when the coarse alignment phase is complete, the receiving integrated circuit time aligns an internal data sequence as provided by an internal data store, and then begins a fine alignment phase in an attempt to align the two data sequences, and to find an appropriate time sampling point.

Figure 3:
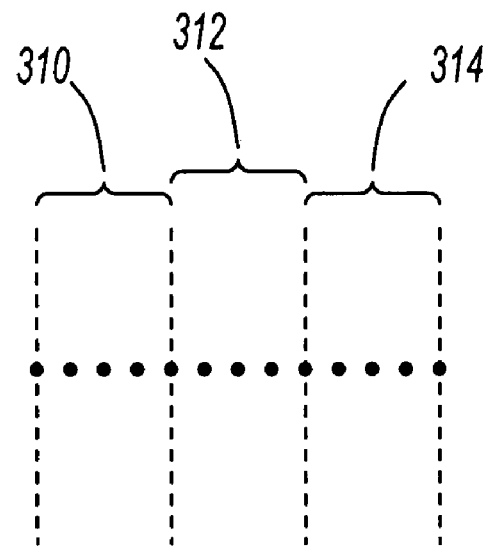
FIG. 3 shows possible sampling points relative to bit intervals.

FIG. 3 shows possible sampling points relative to bit intervals. As shown in FIG. 3, each of bit intervals 310, 312, and 314 includes four possible sampling points. This corresponds to variable clock circuit 124 (FIG. 1) having a resolution of approximately 90 degrees. In some embodiments, variable clock circuits are utilized that have significantly higher resolution corresponding to many more possible sampling points per bit interval. For example, some embodiments of the present invention operate with variable clock circuits having a resolution on the order of a degree, which corresponds to hundreds of possible sampling points per bit interval.

Various embodiments of the present invention perform clock deskew by utilizing various methods to search for an appropriate sampling point. For example, as shown in FIGS. 4 and 5, bit error rates for various sampling points may be compared, and as shown in FIG. 6, bit error rates as a function of amplitude offset may be compared for various sampling points.

Figure 4:
FIGS. 4 and 5 show bit error rates for various sampling points.

FIG. 4 shows bit error rates for various sampling points. In some embodiments, each sampling point corresponds to a 45 degree shift in the clock signal. Referring now back to FIG. 1, the information in FIG. 4 may be gathered by control circuit 134 by modifying control information sent to variable clock circuit 124 to modify the phase of the clock signal used to sample the incoming data waveform. For each sampling point, comparator 128 compares received data and data provided by data store 130. Bit error rate circuit 132 provides the bit error rate data to control circuit 134. As can be seen in FIG. 4, the bit error rate may drop significantly at one sampling point relative to other sampling points. The sampling point having the lower bit error rate may be at or near an appropriate sampling point for equalizing the channel and for normal operation.

Figure 5:
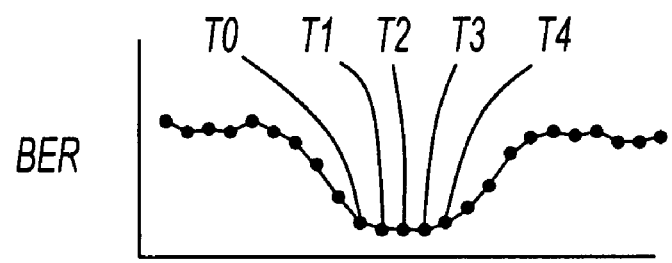

FIG. 5 also shows bit error rates for various sampling points. In some embodiments, each sampling point in FIG. 5 corresponds to a phase shift much smaller than 45 degrees. For example, each sampling point may differ from adjacent sampling points by a degree, or by more or less than a degree. In some embodiments, adjacent sampling points differ by a few degrees. As can be seen in FIG. 5, it may be possible for more than one sampling point to exhibit a low bit error rate. This may be the result of tightly spaced sampling points within a valid data region, or "eye."

Figure 6:
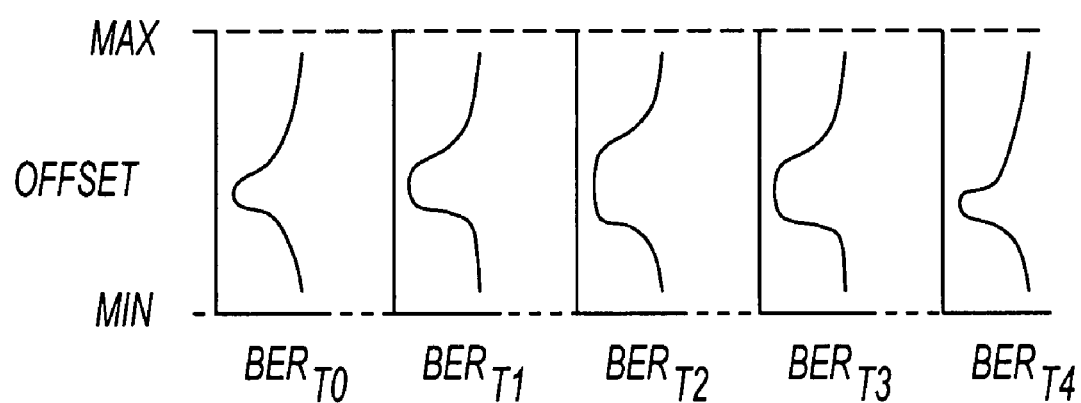
FIG. 6 shows plots of bit error rate versus amplitude offset for multiple sampling points.

FIG. 6 shows plots of bit error rate versus amplitude offset for multiple sampling points. The five plots shown in FIG. 6 correspond to the five sampling points T0, T1, T2, T3, and T4 shown in FIG. 5. Referring now back to FIG. 1, the data shown in FIG. 6 may be gathered by control circuit 134 by sweeping the amplitude offset provided by amplitude offset circuit 126 while measuring bit error rate.

As shown in FIG. 6, bit error rates may vary as a function of sampling point and amplitude offset. Sampling point T2 exhibits a low BER for the largest range of offsets as compared to the other sampling points T0, T1, T3, and T4. Of the five sampling points represented in FIG. 6, T2 samples the data waveform at a time corresponding to the tallest portion of the data eye. Control circuit 134 may choose T2 as the appropriate sampling point during the fine alignment phase, in part because it exhibits the lowest bit error rate extending to the largest offset.

In some embodiments, fine alignment of clock deskew is provided by utilizing a combination of the information as presented in FIGS. 4-6. For example, a coarse time sweep may be performed as shown in FIG. 4. The phase offset resolution of the clock in the coarse time sweep may be 45 degrees as shown in FIG. 4, or may be more or less than 45 degrees. After the coarse time sweep, a fine time sweep may be performed that incorporates an amplitude offset sweep over a range of sampling points. The range of sampling points may be chosen as a number of sampling points before and after the lowest BER sampling point found in the coarse time sweep.

In other embodiments, a coarse time sweep may be performed with an amplitude offset sweep for each sampling point, and in still further embodiments, a fine time sweep is performed without an amplitude offset sweep. Any one of, or any combination of, coarse time sweep, fine time sweep, amplitude offset sweep, or bit error rate calculation may be used for clock deskew without departing from the scope of the present invention.

Figure 7:
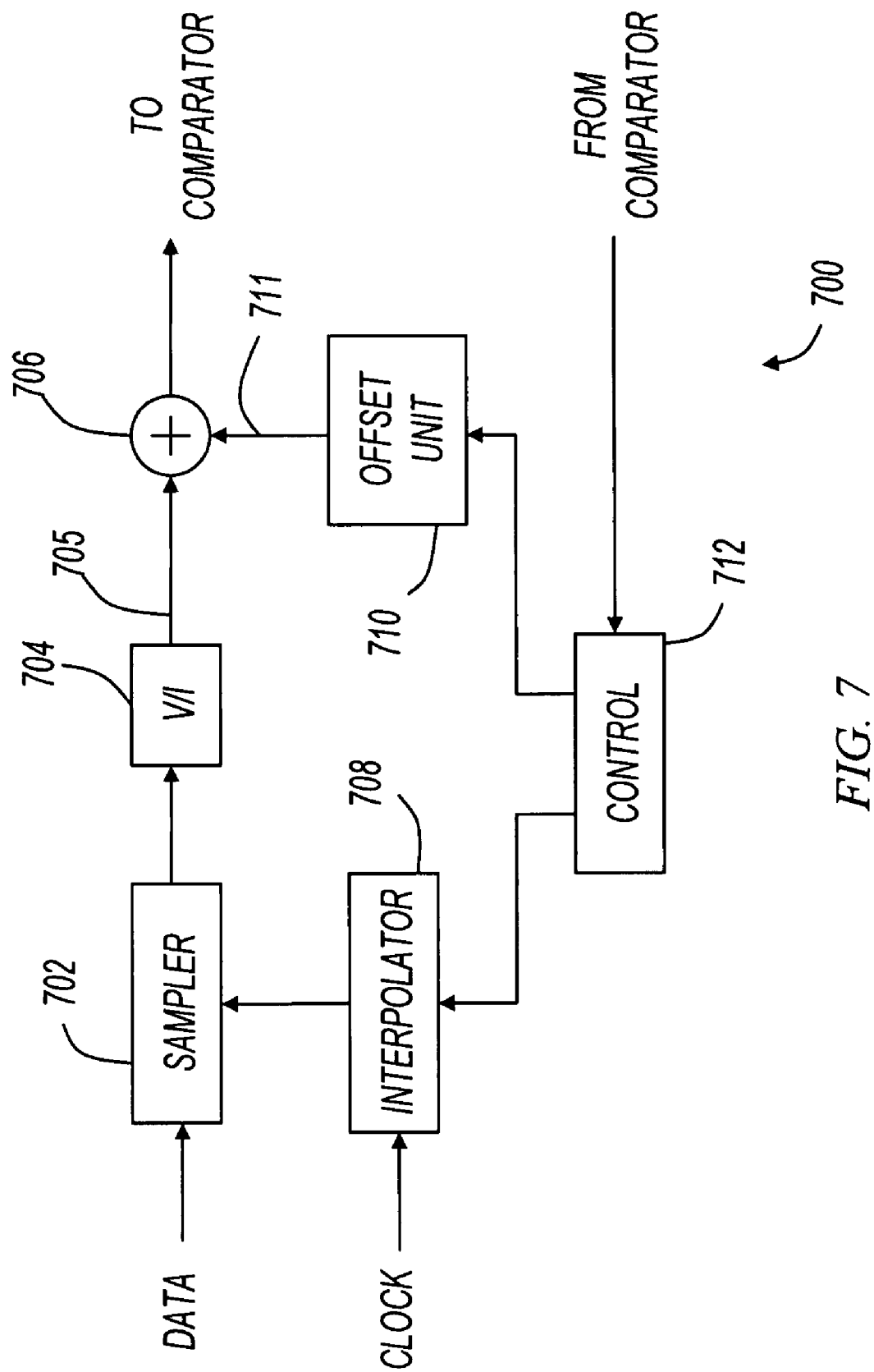
FIG. 7 shows a diagram of a portion of a deskew circuit.

FIG. 7 shows a diagram of a portion of a deskew circuit. Circuit 700 includes sampler 702, voltage to current (V/I) converter 704, current summer 706, interpolator 708, offset unit 710, and control circuit 712. Circuit 700 may be used in conjunction with other circuits such as data stores, comparators, and bit error rate circuits to deskew a clock signal. In operation, sampler 702 receives a data signal and interpolator 708 receives a clock signal. Control circuit 712 provides control information to interpolator 708 and offset unit 710 to vary the clock phase and the amplitude offset.

Sampler 702 samples received data, and sends a signal to V/I 704. In some embodiments, sampler 702 includes an analog to digital converter, and the signal sent to V/I 704 includes a digital signal with multiple bits. In other embodiments, sampler 702 includes a voltage sampling circuit that samples the incoming data and provides a single analog signal to V/I 704. V/I 704 produces a current on node 705 in response to the signal received from sampler 702.

Control circuit 712 provides control information to offset unit 710, and offset unit 710 produces a current on node 711. The current on node 711 is summed with the current on node 705 by summer 706, and the result is sent to the comparator (not shown).

Control circuit 712 also provides control information to interpolator 708 to influence the sampling point at which sampler 702 samples the incoming data. In some embodiments, interpolator 708 receives a single phase clock signal, internally produces clock signals of various phases, and interpolates between the different phase clock signals. In other embodiments, interpolator 708 receives multiple clock signals of differing phases and interpolates between them. For example, in some embodiments, four clock signals are received, each substantially 90 degrees apart.

Clock deskew circuits, and other embodiments of the present invention can be implemented in many ways. In some embodiments, they are implemented in integrated circuits as part of data busses. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, port circuit 700 (FIG. 7) can be represented as polygons assigned to layers of an integrated circuit.

Figure 8:
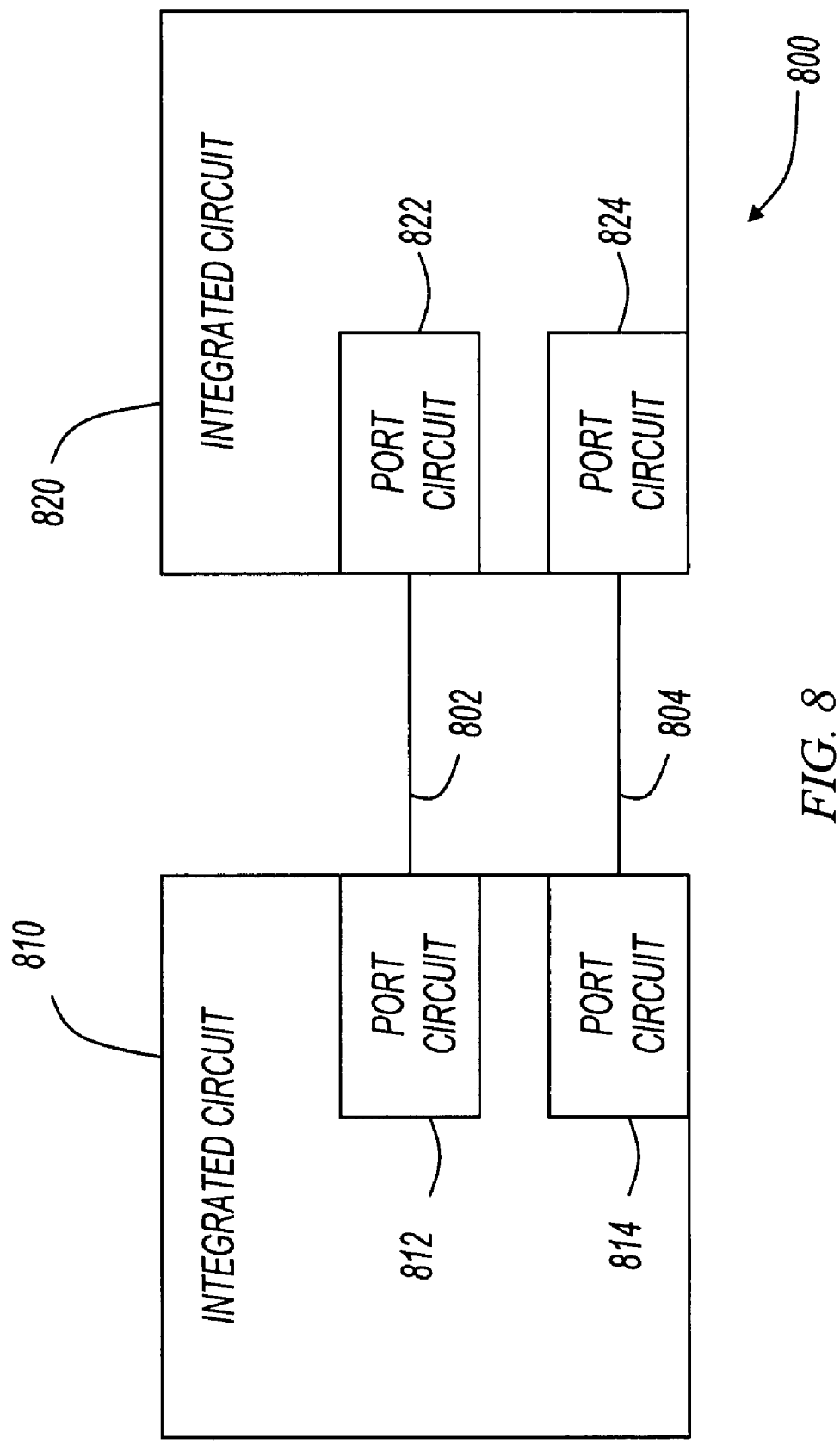
FIG. 8 shows a system diagram in accordance with various embodiments of the present invention.

FIG. 8 shows a system diagram in accordance with various embodiments of the present invention. FIG. 8 shows system 800 including integrated circuits 810 and 820. Integrated circuit 810 includes data port circuits 812 and 814, and integrated circuit 820 includes data port circuits 822 and 824. Data port circuits 812 and 822 are interconnected by conductor 802, and data port circuits 814 and 824 are interconnected by conductor 804. In some embodiments, each data port circuit drives data onto, and receives data from, the conductor to which it is coupled. In these embodiments, conductors 802 and 804 serve as bidirectional signal nodes or simultaneous bidirectional (SBD) signal nodes. In other embodiments, each port circuit either transmits or receives data, and each conductor is unidirectional. For example, port circuits 812 and 824 may transmit data, and port circuits 822 and 814 may receive data. One or more of data port circuits 812, 814, 822, and 824 may include circuitry in support of clock deskew, including that shown in FIGS. 1 and 7.

Integrated circuits 810 and 820 can be any type of integrated circuit capable of including one or more port circuits as shown. For example, either integrated circuit 810 or 820 can be a processor such as a microprocessor, a digital signal processor, a microcontroller, or the like. Either integrated circuit can also be an integrated circuit other than a processor such as an application-specific integrated circuit (ASIC), a communications device, a memory controller, or a memory such as a dynamic random access memory (DRAM) or static random access memory (SRAM). For ease of illustration, portions of integrated circuits 810 and 820 are not shown. The integrated circuits may include much more circuitry than illustrated in FIG. 8 without departing from the scope of the present invention.

Integrated circuits 810 and 820 are shown in FIG. 8 having two data port circuits each. In some embodiments, each integrated circuit may have many more data port circuits. For example, in some embodiments, entire data busses are driven by banks of data port circuits. In other embodiments, nodes for control signals or groups of nodes for control signals are driven by data port circuits.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 9:
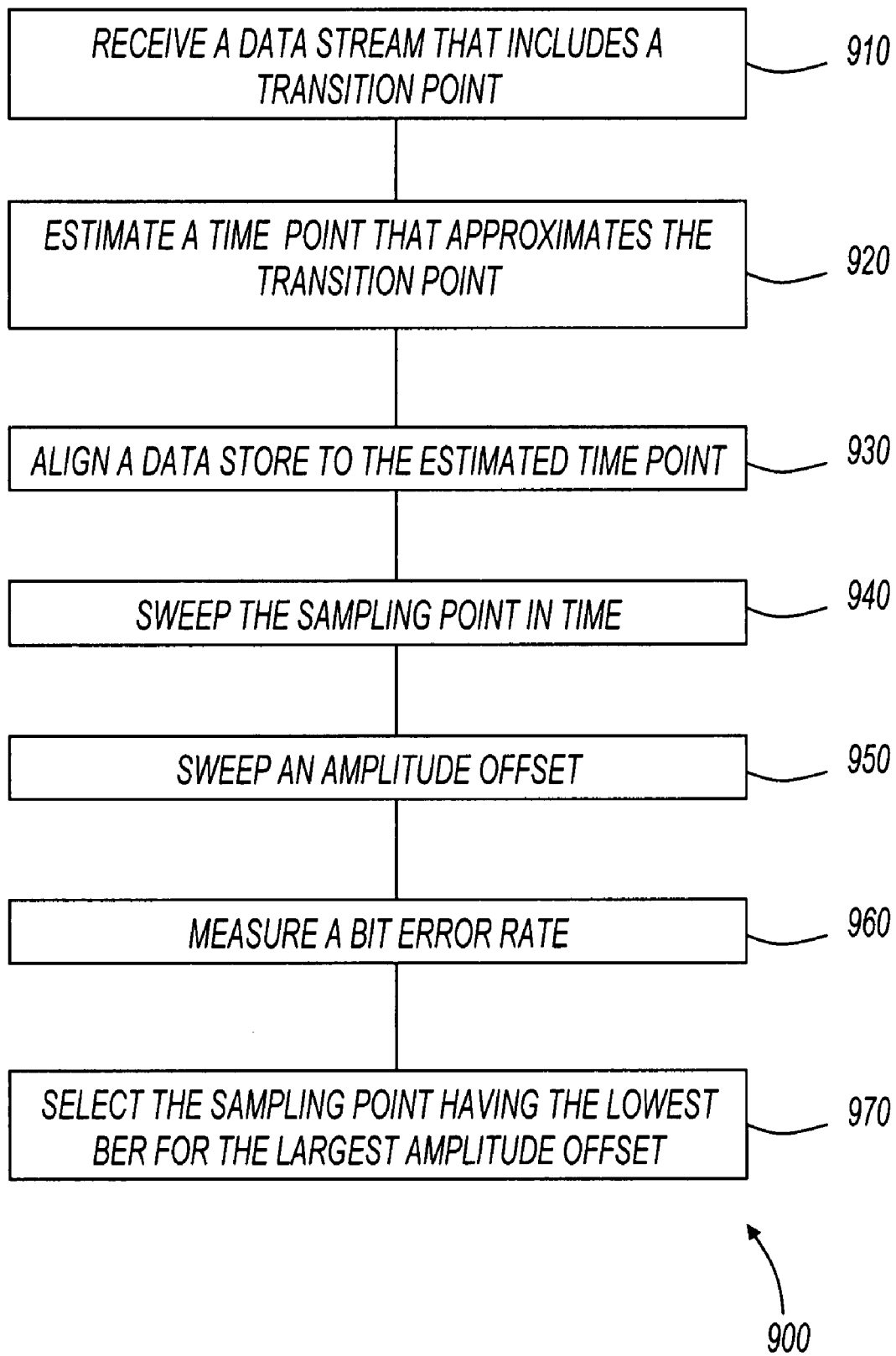
FIG. 9 shows a flowchart in accordance with various embodiments of the present invention.

FIG. 9 shows a flowchart in accordance with various embodiments of the present invention. In some embodiments, method 900, or portions thereof, is performed by a clock deskew apparatus, embodiments of which are shown in previous figures. In other embodiments, method 900 is performed by a control circuit, an integrated circuit, or an electronic system. Method 900 is not limited by the particular type of apparatus performing the method. The various actions in method 900 may be performed in the order presented, or may be performed in a different order. Further, in some embodiments, some actions listed in FIG. 9 are omitted from method 900.

Method 900 is shown beginning with block 910 in which a data stream is received that includes a transition point. The transition point referred to in block 910 corresponds to a transition between a string of one data value and a string of a complementary data value. For example, the transition point may occur between a string of digital ones followed by a string of digital zeros, or may occur between a string of digital zeros followed by a string of digital ones.

At 920, a time point that approximates the transition point is estimated. This may be accomplished by comparing sampled input data against a fixed threshold. The fixed threshold may be set to a standard logic threshold, or may be set to a threshold other than a standard logic threshold to take into account effects of the channel through which the signal travels. Estimating the transition point provides a coarse alignment between a transmitting circuit and a receiving circuit. For example, referring now to FIG. 1, if integrated circuit 120 estimates a transition point, control circuit 134 may coarsely align data store 130 to data store 104.

At 930, a data store is aligned to the estimated transition point. For example, data store 130 (FIG. 1) may be coarsely aligned to data store 104 by commanding data store 130 to start sending a repeating data pattern at a fixed time relative to the estimated time point. In some embodiments of the present invention, data store 104 is also commanded to start sending a repeating data pattern at a fixed time relative to the actual transition point.

At 940, a sampling point is swept in time, at 950 an amplitude offset is swept, and at 960, a bit error rate is measured. In some embodiments, the initial sampling point in the sweep is chosen as the estimated transition point. In other embodiments, a time shift may be added to the estimated transition point to arrive at the initial sampling point. The time shift may be positive or negative. In some embodiments, the amplitude offset is swept for each sampling point such that a bit error rate is measured for a plurality of amplitude offsets at each sampling points. In other embodiments, the amplitude offset is set to a nominal value and the sampling point is swept in time at the nominal amplitude offset. In some of these embodiments, a subset of sampling points are chosen to have the amplitude offset swept.

At 970, the sampling point having the lowest bit error rate for the largest amplitude offset is chosen as the appropriate sampling point. In some embodiments of the present invention, a filter is then trained using the chosen sampling point.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising:
receiving a digital data stream that includes a transition point between a string of one value and a string of a complementary value;
detecting an estimated transition point to approximate the transition point;
time aligning an internal data sequence to the estimated transition point, wherein time aligning comprises starting a linear feedback shift register;
receiving a training sequence, wherein receiving a training sequence comprises sweeping an input amplitude offset; and
comparing data from the training sequence and data from the linear feedback shift register.

2. The method of claim 1 further comprising measuring a bit error rate for multiple input amplitude offsets.

3. The method of claim 2 further comprising sweeping a sampling time.

4. The method of claim 3 further comprising selecting a sampling time corresponding to a lowest bit error rate.

5. The method of claim 3 further comprising selecting a sampling time corresponding to a lowest bit error rate extending to the largest offset.

6. A method comprising:
sampling at a first time point and a first amplitude offset and measuring a bit error rate;
sampling at a second time point and the first amplitude offset and measuring the bit error rate;
selecting the time point at which the bit error rate is lower; and
sampling and measuring bit error rates at a plurality of amplitude offsets.

7. The method of claim 6 further comprising selecting a time point based on an amplitude offset and bit error rate value combination.

8. The method of claim 6 further comprising adapting a filter.

9. A method comprising:
sampling at a first time point and a first amplitude offset and measuring a bit error rate;
sampling at a second time point and the first amplitude offset and measuring the bit error rate;
selecting the time point at which the bit error rate is lower; and
sampling at a plurality of time points in a coarse sweep followed by sampling at a plurality of time points in a fine sweep.

10. A method comprising:
sampling at a first time point and a first amplitude offset and measuring a bit error rate, wherein measuring a bit error rate comprises comparing received data to predetermined data values;
sampling at a second time point and the first amplitude offset and measuring the bit error rate; and
selecting the time point at which the bit error rate is lower.

11. A port circuit comprising:
a sampler having a clock control input;
a variable clock circuit coupled to the clock control input of the sampler, the variable clock circuit adapted to modify a sample time of received samples;
an amplitude offset circuit adapted to offset amplitude of received samples;
a data store; and
a circuit adapted to compare received samples and data from the data store.

12. The port circuit of claim 11 wherein the data store comprises a linear feedback shift register.

13. The port circuit of claim 11 wherein the data store comprises a shift register.

14. The port circuit of claim 13 wherein the data store is adapted to have a variable shift.

15. The port circuit of claim 11 wherein the amplitude offset circuit comprises a variable current source and a current summer.

16. An electronic system comprising a dynamic random access memory having a first port circuit, and a processor including a second port circuit coupled to the first port circuit, the second port circuit including:
    a sampler having a clock control input;
    a variable clock circuit coupled to the clock control input of the sampler, the variable clock circuit adapted to modify a sample time of received samples;
    an amplitude offset circuit adapted to offset amplitude of received samples;
    a data store; and
    a circuit adapted to compare received samples and data from the data store.

17. The electronic system of claim 16 wherein the data store comprises a linear feedback shift register.

18. The electronic system of claim 16 wherein the data store comprises a shift register.

19. The electronic system of claim 18 wherein the data store is adapted to have a variable shift.

20. The electronic system of claim 16 wherein the amplitude offset circuit comprises a variable current source and a current summer.

* * * * *